(12) United States Patent
Akhssay et al.

(10) Patent No.: US 7,262,831 B2
(45) Date of Patent: Aug. 28, 2007

(54) LITHOGRAPHIC PROJECTION APPARATUS AND DEVICE MANUFACTURING METHOD USING SUCH LITHOGRAPHIC PROJECTION APPARATUS

(75) Inventors: M'hamed Akhssay, Helmond (NL); Johannes Jacobus Matheus Baselmans, Oirschot (NL); Franciscus Antonius Chrysogonus Marie Commissaris, Waalre (NL); Simon De Groot, Eindhoven (NL); Andre Bernardus Jeunink, Bergeyk (NL); Wim Tjibbo Tel, Helmond (NL); Alexander Hendrikus Martinus Van Der Hoff, Valkenswaard (NL); Arnout Van De Stadt, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/000,507

(22) Filed: Dec. 1, 2004

(65) Prior Publication Data

US 2006/0114437 A1    Jun. 1, 2006

(51) Int. Cl.
*G03B 27/52* (2006.01)
*G03B 27/42* (2006.01)
*G03B 27/68* (2006.01)

(52) U.S. Cl. .................. 355/52; 355/53; 355/55; 355/77; 430/22; 430/30

(58) Field of Classification Search ............ 355/52, 355/53, 55
See application file for complete search history.

(56) References Cited

U.S. PATENT DOCUMENTS

| 4,399,356 | A | 8/1983 | Feinleib et al. |
| 4,413,909 | A | 11/1983 | Pohle |
| 4,518,854 | A | 5/1985 | Hutchin |
| 4,540,277 | A | 9/1985 | Mayer et al. |
| 5,229,872 | A | 7/1993 | Mumola |
| 5,296,891 | A | 3/1994 | Vogt et al. |
| 5,337,097 | A | 8/1994 | Suzuki et al. |
| 5,357,311 | A | 10/1994 | Shiraishi |
| 5,523,193 | A | 6/1996 | Nelson |
| 5,715,039 | A | 2/1998 | Fukuda et al. |
| 5,801,815 | A | 9/1998 | Takahashi |
| 5,835,217 | A | 11/1998 | Medecki |

(Continued)

FOREIGN PATENT DOCUMENTS

DE    198 26 409 A    1/2000

(Continued)

*Primary Examiner*—D. Rutledge
(74) *Attorney, Agent, or Firm*—Pillsbury Winthrop Shaw Pittman LLP

(57) ABSTRACT

A lithographic projection apparatus includes a measurement system for measuring changes in projection system aberrations with time, and a predictive control system for predicting variation of projection system aberrations with time on the basis of model parameters and for generating a control signal for compensating a time-varying property of the apparatus, such as the OVL values (X-Y adjustment) and the FOC values (Z adjustment) of a lens of the projection system for example. An inline model identification system is provided for estimating model parameter errors on the basis of projection system aberration values provided by the predictive control system and measured projection system aberration values provided by the measurement system, and an updating system utilizes the model parameter errors for updating the model parameters of the predictive control system in order to maintain the time-varying property within acceptable performance criteria.

20 Claims, 5 Drawing Sheets

U.S. PATENT DOCUMENTS

| | | |
|---|---|---|
| 5,953,106 A | 9/1999 | Unno et al. |
| 5,969,441 A | 10/1999 | Loopstra et al. |
| 5,978,085 A | 11/1999 | Smith et al. |
| 6,046,792 A | 4/2000 | Van Der Werf et al. |
| 6,115,108 A | 9/2000 | Capodieci |
| 6,563,564 B2 | 5/2003 | de Mol et al. |

FOREIGN PATENT DOCUMENTS

| | | |
|---|---|---|
| EP | 1 128 217 A2 | 8/2001 |
| EP | 1 164 436 A2 | 12/2001 |
| EP | 1 251 402 A1 | 10/2002 |
| EP | 1 164 436 A3 | 1/2005 |
| WO | WO98/33096 | 7/1998 |
| WO | WO98/38597 | 9/1998 |
| WO | WO98/40791 | 9/1998 |
| WO | WO 01/63233 A2 | 8/2001 |
| WO | WO 01/63233 A3 | 8/2001 |

LITHOGRAPHIC PROJECTION APPARATUS AND DEVICE MANUFACTURING METHOD USING SUCH LITHOGRAPHIC PROJECTION APPARATUS

FIELD OF THE INVENTION

This invention relates to lithographic projection apparatus and a device manufacturing method using such lithographic projection apparatus.

BACKGROUND OF THE INVENTION

The invention finds application in the field of lithographic projection apparatus that incorporates a radiation system for supplying a projection beam of radiation, a support structure for supporting a patterning device, which serves to pattern the projection beam according to a desired pattern, a substrate table for holding a substrate; and a projection system for projecting the patterned beam onto a target portion of the substrate.

The term "patterning device" as employed here should be broadly interpreted as referring to devices that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the said non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localised electric field, or by employing piezoelectric actuators. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic circuits. In both of the situations described here above, the patterning device can include one or more programmable mirror arrays. More information on mirror arrays as here referred to can be gleaned, for example, from U.S. Pat. No. 5,296,891 and U.S. Pat. No. 5,523,193, and from WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For simplicity, parts of the rest of this specification are directed specifically to examples involving a mask and mask table; however, the general principles discussed in such instances should be seen in the broader context of the patterning device as set forth above.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information on such lithographic devices is disclosed in U.S. Pat. No. 6,046,792, the contents of which are incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This combination of processing steps is used as a basis for patterning of a single layer of the device which is for example an integrated circuit (IC). Such a patterned layer may then undergo various processes, such as etching, ion-implantation (doping), metallisation, oxidation, chemical-mechanical polishing, etc., all of which are intended to finish off an individual layer. If several layers are required, then the whole procedure, or a variant thereof, will have to be repeated for each new layer. Eventually, an array of devices will be produced on the substrate (wafer). These devices are then separated from one another by a technique such as dicing or sawing, so that the individual devices can be mounted on a carrier, connected to pins, etc. Further information regarding such processing can be obtained, for example, from "Microchip Fabrication: A Practical Guide to Semiconductor Processing", Third Edition, by Peter van Zant, McGraw Hill Publishing Co., 1997, ISBN 0-07-067250-4, incorporated herein by reference.

For simplicity, the projection system may hereinafter be referred to as the "lens". However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Furthermore, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus is described, for example, in U.S. Pat. No. 5,969, 441 and WO 98/40791, the contents of both of which are incorporated herein by reference.

Although specific reference may be made in this specification to the use of the apparatus according to the invention in the manufacture of integrated circuits, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The person skilled in the art will appreciate that, in the context of such alternative applications, any use of the terms "wafer" or "die" in this text should be considered as being replaced by the more general terms "substrate" and "target portion", respectively. Generally, throughout the specification, any use of the term "mask" should be considered as encompassing within its scope the use of the term "reticle"

In the present document, the terms "radiation" and "projection beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm).

The phenomenon of lens heating can occur in the projection system of a lithographic projection apparatus. The projection lens becomes slightly heated by the projection beam radiation during exposures. As a result of this heating, refractive index changes occur, and a certain expansion of lens elements occurs, causing subtle changes in the geometric form of those elements, with an attendant change in their optical properties. This can result in the occurrence of new lens aberrations, or a change in existing aberrations. Because the occurrence of these aberration changes depends on such matters as the particular lens geometry, lens material, projection wavelength, light source power, target portion, wafer-reflectivity, size, and so on, the accuracy with which the effects of such lens heating can be predicted can be limited, especially in the absence of any measurement and compensating mechanism.

Lens heating has always occurred to some extent in lithographic projection apparatus. However, with the trend to integrating an ever-increasing number of electronic components, and thus smaller features, in an IC, and to increase the manufacturing throughput, shorter wavelength radiation, such as EUV radiation has been used, as well as high-power radiation sources, such as 3-6 kW Mercury-arc lamps and excimer lasers with a power of 10 to 20 W, which together with the reduction in feature size have made lens heating a more serious problem. The problem is generally worse in scanners than in steppers because, in a stepper, substantially the whole (circular) cross-section of each lens element is irradiated, whereas, in a scanner, generally only a slit-shaped portion of the lens elements is irradiated; consequently, the effect in a scanner is far more differential than in a stepper, even if the lens aberrations in the scan direction are averaged out in the scanner, thereby resulting in the occurrence of new lens aberrations.

The change in the optical properties of the elements of the projection system due to such lens heating naturally affects the image that is projected, principally by causing a change in the image parameters, of which magnification is particularly important for the XY-plane, and focus is particularly important for the Z-plane. However this lens heating effect can be calibrated and compensated for very well, e.g. by adjusting the positions of the lens elements to effect a compensating change in magnification or other image parameters of the projection system, for example as disclosed in EP 1164436A or U.S. Pat. No. 6,563,564, the contents of both of which are incorporated herein by reference. The lens heating effects depend on the lens properties, which are calibrated when the apparatus is constructed and may be recalibrated periodically thereafter, and various parameters of the exposures carried out, such as mask transmission, dose, illumination settings, field size and substrate reflectivity.

When performing imaging in a lithographic projection apparatus, despite the great care with which the projection system is designed and the very high accuracy with which the system is manufactured and controlled during operation, the image can still be subject to aberrations, which can cause offsets in the image parameters, such as, for example, distortion (i.e. a non-uniform image displacement in the target portion at the image plane: the XY-plane), lateral image shift (i.e. a uniform image displacement in the target portion at the image plane), image rotation, and focal plane deformation (i.e. a non-uniform image displacement in the Z-direction, for instance field curvature). It should be noted that, in general, image parameter offsets are not necessarily uniform, and can vary as a function of position in the image field. Distortion and focal plane deformation can lead to overlay and focus errors, for example overlay errors between different mask structures, and line-width errors. As the size of features to be imaged decreases, these errors can become intolerable.

Consequently, it is desirable to provide compensation (such as adjustment of the projection system and/or substrate) to correct for, or at least attempt to minimize, these errors. This presents the problems of first measuring the errors and then calculating appropriate compensation. Previously, alignment systems were used to measure the displacements in the image field of alignment marks. However, alignment marks typically consist of relatively large features (of the order of a few microns), causing them to be very sensitive to specific aberrations of the projection system. The alignment marks are unrepresentative of the actual features being imaged, and, because the imaging errors depend inter alia on feature size, the displacements measured and compensations calculated do not necessarily optimize the image for the desired features.

Another problem occurs when, for instance, because of residual manufacturing errors, the projection system features asymmetric variations of aberrations over the field. These variations may be such that at the edge of the field the aberrations become intolerable.

A further problem occurs when using phase-shift masks (PSM's). Conventionally, the phase shift in such masks has to be precisely 180 degrees. The control of the phase is critical; deviation from 180 degrees is detrimental. PSM's, which are expensive to make, must be carefully inspected, and any masks with substantial deviation in phase shift from 180 degrees will generally be rejected. This leads to increased mask prices.

A further problem occurs with the increasing requirements imposed on the control of critical dimension (CD). The critical dimension is the smallest width of a line, or the smallest space between two lines, permitted in the fabrication of a device. In particular the control of the uniformity of CD, the so-called CD uniformity, is of importance. In lithography, efforts to achieve better line width control and CD uniformity have recently led to the definition and study of particular error types occurring in features obtained during exposure and processing. For instance, such image error types may include an asymmetric distribution of CD over a target portion, an asymmetry of CD with respect to defocus (which results in a tilt of Bossung curves), asymmetries of CD within a feature comprising a plurality of bars (commonly referred to as Left-Right asymmetry), asymmetries of CD within a feature comprising either two or five bars (commonly known as L1-L2 and L1-L5, respectively), differences of CD between patterns that are substantially directed along two mutually orthogonal directions (for instance the so-called H-V lithographic error), and for instance a variation of CD within a feature, along a bar, commonly known as C-D. As in the case of the aberrations mentioned above, these errors are generally non-uniform over the field. For simplicity we will hereafter refer to any of these error types, including errors such as, for example, distortion, lateral image shift, image rotation, and focal plane deformation, as lithographic errors, i.e. feature-deficiencies of relevance for the lithographer.

Lithographic errors are caused by specific properties of the lithographic projection apparatus. For instance, aberrations of the projection system, or imperfections of the patterning device and imperfections of patterns generated by the patterning device, or imperfections of the projection beam may cause such lithographic errors. However, also nominal properties (i.e. properties as designed) of the lithographic projection apparatus may cause unwanted lithographic errors. For instance, residual lens aberrations which are part of the nominal design may cause lithographic errors. For reference hereafter, we will refer to any such properties that may cause lithographic errors as "properties".

As mentioned above, the image of a pattern can be subject to aberrations of the projection system. A resulting variation of CD (for example, within a target portion) can be measured and subsequently mapped to an effective aberration condition of the projection system which could produce the measured CD variation. A compensation can then be applied to the lithographic projection system so as to improve CD uniformity. Such a CD control method is described in U.S. Pat. No. 6,115,108, incorporated herein by reference, and comprises imaging of a plurality of test patterns at each field point of a plurality of field points, subsequent processing of the exposed substrate, and subsequent CD measurement for each of the imaged and processed test patterns. Consequently, the method is time consuming and not suitable for in-situ CD control. With increasing demands on throughput (i.e. the number of substrates that can be processed in a unit of time) as well as CD uniformity, there is a need for the control, compensation and balancing of lithographic errors to be improved, and hence there is a need for further appropriate control of the properties.

U.S. Pat. No. 6,563,564 (P-0190) discloses a lens heating model by which projection system aberrations due to the lens heating effect can be corrected for by way of image parameter offset control signals that serve to adjust the image parameters of the projection system to compensate for the calculated change in the aberration effect due to such lens heating. In this case the change in the aberration effect with time is determined on the basis of a stored set of predetermined parameters corresponding to the selected aberration effect, these parameters preferably being obtained by a calibration step. The image parameter offsets may comprise focus drift, field curvature, magnification drift, third-order distortion, and combinations thereof. However, the required ideal compensation will depend on the particular application (the particular pattern, illumination mode, etc.), and the number of parameters that can be adjusted is generally not high enough to cancel out every aberration completely, so that the determination of the compensation to apply in a particular case will always be a compromise, the particular compromise to be chosen depending on the required application. Because the conventional lens heating model does not take into account the particular application, it follows that the calculated compensation will not be optimal for every particular application.

EP 1251402A1 (P-0244) discloses an arrangement for compensating for projection system aberrations on the basis of the relationship between the properties of the substrate, the layer of radiation sensitive material on the substrate, the projection beam, the patterning device and the projection system, and the lithographic errors causing anomalies in the projected image. A control system determines a merit function which weighs and sums the lithographic errors, and calculates a compensation to apply to at least one of the substrate, the projection beam, the patterning device and the projection system to optimize the merit function. Although the use of such a merit function enables compensation to be applied in such a manner as to reach a reasonable compromise in terms of optimization of the image, it is found that, since such optimization is intended to provide the best compromise in terms of imaging quality over the whole of the image, the image quality in parts of the image or in particular applications may be relatively low.

A control system may be provided for compensating for the effect of changes in a property of lithographic projection apparatus with time, such as the change in magnification of the projection system due to lens heating, in which a control signal is generated according to a predicted change in the property with time according to a defined model, a comparator compares a value based on the predicted change to a threshold, and generates a trigger signal when the value is greater than the threshold value, and the alignment system performs an alignment in response to the trigger signal. Such an arrangement triggers a so-called "realignment" when the predictive correction becomes larger than the desired maximum. This system therefore predicts the heating effects that will occur in performing a series of exposures and applies appropriate corrections in advance of the exposures being made when the corresponding threshold value is exceeded. This technique ensures that realignments occur only when errors are out of certain ranges, and avoids unnecessary realignments, thus avoiding loss of throughput in the exposure process. In certain applications errors in the predictive correction may result in unnecessary additional alignment steps and loss of throughput, since the optimal time for realignment is not calculated on the basis of the particular application. This could mean in practice that the imaging performance is worse than expected in a particular series of exposures due to the realignment being triggered too late for the particular application; or that the throughput is less than expected due to the realignment being effected sooner than required in the series of exposures.

Furthermore, since the model is in many situations non-linear with respect to parameters such as illumination setting and energy dose, it is necessary for the model to be calibrated for the particular application that is to be performed, that is at a particular working point (illumination setting, energy dose, etc.). The model can then be used by interpolation for modeling the performance at non-calibrated working points. However calibration of the model for use at a selected working point, that is at a fixed energy dose and illumination level, can be very time-consuming due the offline nature of the calibration process, and this can mean that the availability of the lithographic projection apparatus is reduced for at least eight hours. Additionally the calibrated model may still be inaccurate because the lens heating is dependent on the combination of product structure and illumination mode, and the interpolation to other working points may be poor.

SUMMARY OF THE INVENTION

It is an object of the present invention to effect adjustments to the projection system of lithographic projection apparatus to compensate for the effect of lens aberrations in such a manner as to correct for predictive errors based on imprecisely known aberrations and to reduce the throughput loss caused by unnecessary alignment steps.

According to the present invention there is provided lithographic projection apparatus including a radiation system for providing a projection beam of radiation, a support structure for supporting a patterning device for imparting a pattern to the projection beam, a substrate table for holding a substrate, a projection system for projecting the patterned beam onto a target portion of the substrate so as to produce an image of the patterning means on the target portion, a measurement system for measuring changes in projection system aberrations with time, a predictive control system for predicting variation of projection system aberrations with time and for generating a control signal for compensating a time-varying property of the apparatus, an inline model identification system for estimating model parameter errors on the basis of projection system aberration values provided by the predictive control system and measured aberration values provided by the measurement system, and an updating system utilising the model parameter errors for updating the model parameters used in the predictive control system in dependence on the deviation of measured value with respect to a reference value of the time-varying property in order to maintain the time-varying property within acceptable performance criteria.

Such an updating system can be used in an inline calibration method performed under customer conditions, that is in a dedicated layer calibration phase carried out during lot production for example. This inline calibration method is preferred to the time-consuming offline calibration procedure. This is because the offline calibration procedure typically consists of two consecutive phases, namely an exposure phase followed by a model-and-update phase. During the exposure phase one or more wafers are exposed for the purpose of pure data gathering. However the wafers exposed in this manner are not meant to be used as regular production wafers. During such offline calibration, the apparatus cannot be used for lot production. The wafers are only used in the offline calibration to simulate the behaviour of the apparatus during normal lot production.

By contrast, inline calibration can be performed during normal lot production. Therefore, because of the nature of the inline calibration technique, the availability of the lithographic projection apparatus is not compromised during such calibration. Moreover, this has the advantage that the compensation can be optimised for the particular application, for example to keep overlay and focal errors below user defined values during the inline calibration phase. Typically, during the initial phase of the inline calibration method, the available lens heating correction model is not optimal and, while lot production is proceeding, aberration measurements are performed in a feedback control loop. Each time new measured aberration data becomes available, improved lens heating correction parameters are calculated. The measurement frequency (that is the time interval between aberration measurements) may be related to the lens heating model parameter error such that, if the predictive parameter error increases, the time interval between measurements is reduced, whereas, if the predictive parameter error decreases, the confidence in the prediction model increases and therefore the time interval between measurements is increased. This ensures that the time-varying property remains within acceptable performance criteria when the predictive model is not sufficiently accurate, and avoids unnecessary measurements when the predictive model is sufficiently accurate, thus keeping the availability of the apparatus for substrate exposure at an optimum level. This technique can result in smaller model errors that can in turn result in lower feedback frequency, and can therefore result in an optimal trade-off between productivity, availability and overlay/imaging performance.

When measurement data becomes available, it can be used to produce the model parameter error values. Furthermore the lens heating drift history is preferably stored for modeling purposes. The data history is expanded each time new data becomes available, and the relevant exposure information is stored in the data history. Both measurement data and exposure information are required to construct a model that describes the lens heating behaviour.

In a preferred embodiment a comparator is provided for comparing the control signal to a threshold and for supplying a realignment signal to a realignment system when the control signal exceeds the threshold in order to trigger further projection system aberration measurement, to thereby provide updated measured aberration values. Although not essential, it is convenient for such a comparator to be used to trigger a realignment procedure in which updated measured aberration values are supplied at a suitably controlled sampling frequency to determine the model error for refining of the prediction model. The use of thresholds ensures that appropriate realignments are made only when these thresholds are exceeded, so that the effect on throughput is minimised whilst still keeping good imaging performance.

Preferably the measurement system serves to measure changes in projection system aberrations with time during exposure of a lot of substrates and, when triggered to do so, to effect a further measurement at a predetermined time during the exposure of the lot of substrates, such measurements preferably being made after exposure of a current substrate and before the start of exposure of a subsequent substrate.

Furthermore a modeling system (hereinafter termed an IQEA model) is preferably provided for determining the application-specific effect of the predicted projection system aberration variation on certain parameters of the image of selected patterning device to be used in the apparatus for producing a specific required patterned beam. In this case the control system may generate a control signal specific to the required patterned beam according to the predicted projection system aberration variation and its application-specific effect on certain parameters of the image. The modeling system stores measurement history and relevant exposure information history, for use in updating of the model parameters of the predictive control system.

In this specification the term "application" is used to denote the combination of the patterning device (the mask) and the illumination mode. In this regard the patterning device may be a conventional mask or reticle or a phase shift mask (PSM) and may be characterized by the feature size, the orientation, the density, etc. of the pattern to be produced on the product by the patterning device), and the illumination mode may be characterized by the numerical aperture (NA), the sigma inner/outer, the diffractive optical elements (DOE's), etc.

Such an arrangement enables those aberrations to be compensated for that are of most significance to the particular application (the particular pattern, illumination mode, etc.) in preference to aberrations that are of lesser significance in relation to that particular application. The appropriate adjustments to compensate for such aberrations in the particular application can then be determined and applied in such a manner to cancel out the effect of the aberrations optimally for the given application. For example, when the product pattern or part of the product pattern to be lithographically exposed has only horizontal lines as the features that require to be accurately defined by the lithographic exposure, such an arrangement will ensure that the effect of the aberrations of the projection system will be cancelled out optimally only for such horizontal lines and not for vertical lines. The fact that, in this example, the effect of the aberrations so far as hypothetical vertical lines are concerned is not compensated for is immaterial since no such vertical lines require to be defined accurately in the product or the relevant part of the product.

Additionally the comparator is preferably arranged to compare the control signal to a threshold determined by a user-defined lithographic specification according to the required application. This also serves to ensure that the aberrations of most significance to the particular application are cancelled out optimally for the given application. Furthermore the comparator may be arranged to compare the control signal to a threshold that is increased each time that a realignment of the control signal is performed. This enables the frequency of realignments to be decreased as the modeling errors become less.

Additionally an adjustment system is usually provided for carrying out imaging adjustments in dependence on the control signal to compensate for the effect of the predicted projection system aberration variation on the image of the selected patterning device.

The control system is conveniently arranged to generate the control signal in accordance with the known sensitivities of the selected patterning device to projection system aberrations and a defined merit function determining the relative weightings to be given to different projection system aberrations.

In a preferred implementation of the invention the control system is arranged to determine the projection system aberration variation on the basis of a lens heating model that predicts changes in at least one aberration value with time as a result of lens heating or cooling. Using an appropriate lens heating model it is possible for appropriate aberration offsets to be predicted in advance so that these aberration offsets can be used to determine the offsets in image parameters which can be used to calculate and thus apply appropriate (optimized with respect to a user-defined merit function) adjustments for the given application.

The adjustment system can be constituted by any suitable compensation system for compensating for the effect of the aberration changes. Compensation systems suitable for use with lithographic projection apparatus are, for instance, actuators enabling a fine positioning (an X-, Y-, and Z-translation, and a rotation about the X-, Y-, and Z-axis) of the holder for holding the patterning device, actuators enabling a similar fine positioning of the substrate table, systems to move or deform optical elements (in particular, to fine position, using an X-, Y-, and Z-translation/rotation, optical elements of the projection system), and, for instance, systems to change the energy of the radiation impinging on the target portion. However, suitable compensation systems are not limited to such examples, for instance, controllers to change the wavelength of the radiation beam, controllers to change the pattern, systems to change the index of refraction of gas-filled spaces traversed by the projection beam, and systems to change the spatial distribution of the intensity of the radiation beam may also serve to effect the required compensation.

The adjustment system may be adapted to adjust one of: the position of the support structure along the optical axis of the projection system, the rotational orientation of the support structure, the position of the substrate table along said optical axis, the rotational orientation of the substrate table, the position along said optical axis of one or more movable lens elements comprised in said projection system, the degree of decentering with respect to said optical axis of one or more movable lens elements comprised in said projection system, the central wavelength of the projection beam, and saddle-like deformation of one or more lens elements comprised in said projection system using edge actuators.

The invention further provides lithographic projection apparatus including a radiation system for providing a projection beam of radiation, a support structure for supporting a patterning device for imparting a pattern to the projection beam, a substrate table for holding a substrate, a projection system for projecting the patterned beam onto a target portion of the substrate so as to produce an image of the patterning device on the target portion, a measurement system for measuring changes in projection system aberrations with time, a predictive control system for predicting variation of projection system aberrations with time on the basis of model parameters and for generating a control signal for compensating a time-varying property of the apparatus, and a measurement timing system for controlling measurements by the measurement system such that the time interval between measurements is increased if the control signal decreases below a first threshold value, and the time interval between measurements is decreased if the control signal increases above a second threshold value, in order to maintain the time-varying property within acceptable performance criteria while avoiding unnecessary measurements when the predictive modeling is sufficiently accurate.

In this case the measurement timing system is used without inline calibration, the realignment being triggered by a threshold on the predictive model error. The idea is that the realignment frequency depends on the quality (performance) of the predictive model.

The invention further provides a device manufacturing method using lithographic projection apparatus, the method including providing a substrate having a target portion for receiving an image, selecting a patterning device in accordance with a required patterning application, using a projection system to project a selected beam of radiation onto the patterning device to produce a specific required patterned beam providing an image of the patterning means on the target portion, measuring changes in projection system aberrations with time, predicting variation of projection system aberrations with time on the basis of model parameters and generating a control signal for compensating a time-varying property of the apparatus, performing inline model identification by estimating model parameter errors on the basis of predicted projection system aberration values and measured projection system aberration values, and updating the model parameters of in dependence on the model parameter errors in order to maintain the time-varying property within acceptable performance criteria.

The invention also provides a data carrier incorporating a computer program for controlling a device manufacturing method using lithographic projection apparatus, the apparatus including a radiation system for providing a projection beam of radiation, a support structure for supporting patterning means for imparting a pattern to the projection beam, a substrate table for holding a substrate, and in adjustable projection system for projecting the patterned beam onto a target portion of the substrate so as to produce an image of the patterning means on the target portion, the computer program being arranged to effect the following control actions, measuring changes in projection system aberrations with time, predicting variation of projection system aberrations with time on the basis of model parameters and generating a control signal for compensating a time-varying property of the apparatus, performing inline model identification by estimating model parameter errors on the basis of predicted projection system aberration values and measured projection system aberration values, and updating the model parameters of in dependence on the model parameter errors in order to maintain the time-varying property within acceptable performance criteria.

BRIEF DESCRIPTION OF THE DRAWINGS

An embodiment of the invention will now be described, by way of example only, with reference to the accompanying drawings, in which.

DETAILED DESCRIPTION OF THE PREFERRED EMBODIMENT

Figure 1:
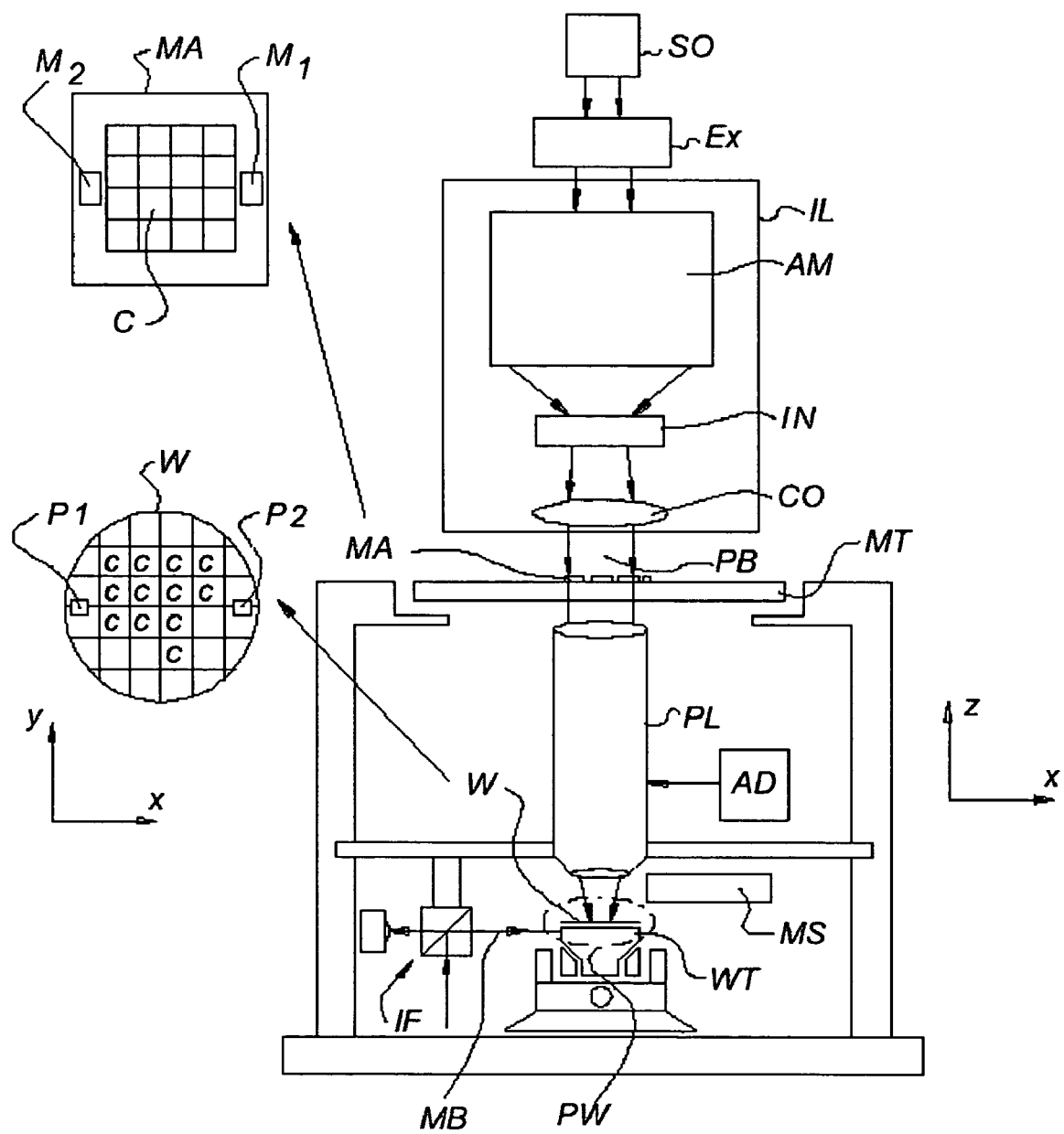
FIG. 1 depicts lithographic projection apparatus for carrying the invention into effect.

FIG. 1 schematically depicts lithographic projection apparatus including at least one marker structure in accordance with an embodiment of the invention. The apparatus includes:

- an illumination system IL for providing a projection beam PB of radiation (e.g. UV or EUV radiation). In this particular case, the radiation system also comprises a radiation source SO;
- a first support structure MT (e.g. a mask table) for supporting a patterning device, MA (e.g. a mask) and connected to first positioning actuator (not shown) for accurately positioning the patterning device with respect to item PL;
- a second support structure WT (e.g. a wafer table) for holding a substrate, W (e.g. a resist-coated silicon wafer) and connected to second positioning actuator PW for accurately positioning the substrate with respect to item PL; and
- a projection system PL (e.g. a reflective projection lens) for imaging a pattern imported to the projection beam PB by patterning device MA onto a target portion C (e.g. comprising one or more dies) of the substrate W.

The projection system PL is provided with an actuating device AD for adapting the optical settings of the system. The operation of adapting the optical settings will be explained hereinafter in more detail.

As depicted here, the apparatus is of a transmissive type (i.e. has a transmissive mask). However the apparatus may alternatively be of a reflective type (with a reflective mask). Alternatively the apparatus may employ another kind of patterning device, such as a programmable mirror array of a type as referred to above.

The source SO (e.g. a mercury lamp or an excimer laser) produces a beam of radiation. This beam is fed into an illumination system (illuminator) IL, either directly or after having traversed conditioning optical elements, such as a beam expander Ex, for example. The illumination system IL may comprise adjustable optical elements AM for setting the outer and/or inner radial extent (commonly referred to as σ-outer and σ-inner, respectively) of the intensity distribution of the beam PB. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that the source SO may also be remote from the lithographic projection apparatus, the beam which it produces being led into the apparatus (e.g. with the aid of suitable directing mirrors). This latter scenario is often the case when the source SO is an excimer laser. The present invention is applicable to both of these scenarios.

The beam PB is incident on the mask MA, which is held on the mask table MT. Having traversed the mask MA, the beam PB passes through the lens PL, which focuses the beam PB onto a target portion C of the substrate W. With the aid of the second positioning actuator PW and interferometer IF, the substrate table WT can be moved accurately, e.g. so as to position different target portions C in the path of the beam PB. Similarly, the first positioning actuator (acting on the mask table MT) can be used to accurately position the mask MA with respect to the path of the beam PB, e.g. after mechanical retrieval of the mask MA from a mask library, or during a scan. In general, movement of the object tables MT, WT will be realised with the aid of a long-stroke module (coarse positioning) and a short-stroke module (fine positioning), which are not explicitly shown in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT and the substrate table WT are kept essentially stationary, and an entire pattern imported to the beam PB is projected in one go (i.e. a single "flash") onto a target portion C. The substrate table WT is then shifted in the X and/or Y directions so that a different target portion C can be irradiated by the beam PB.

2. In scan mode, essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=M v, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

In a non-illustrated variant embodiment the substrate table is replaced by a twin-stage arrangement comprising two substrate tables to which the wafers are supplied so that, whilst one of the wafers is being exposed in one or other of the different modes described above, another of the wafers is being subjected to the necessary measurements to be carried out prior to exposure, with a view to decreasing the amount of time that each wafer is within the exposure zone and thus increasing the throughput of the apparatus.

The interferometer typically can comprise a light source, such as a laser (not shown), and one or more interferometers for determining some information (e.g. position, alignment, etc.) regarding an object to be measured, such as a substrate or a stage. In FIG. 1, a single interferometer IF is schematically depicted by way of example. The light source (laser) produces a metrology beam MB which is routed to the interferometer IF by one or more beam manipulators. In the case where more than one interferometer is present, the metrology beam is shared between them, by using optics that split the metrology beam into separate beams for the different interferometers.

A substrate alignment system MS for alignment of a substrate on the table WT with a mask on the mask table MT, is schematically shown at an exemplary location close to the table WT, and comprises at least one light source which generates a light beam aimed at a marker structure on the substrate W and at least one sensor device which detects an optical signal from that marker structure. It is to be noted that the location of the substrate alignment system MS depends on design conditions which may vary with the actual type of lithographic projection apparatus.

Furthermore the lithographic projection apparatus comprises an electronic control system in the form of a computer arrangement which is capable of controlling and adjusting machine parameters during execution of a series of imaging and exposure steps during processing of a lot of wafers using a common mask. The computer arrangement as used in the preferred embodiment of the invention comprises a host processor connected to memory units which store instructions and data, one or more reading units for reading CD ROM's for example, input devices such as a keyboard and a mouse, and output devices such as a monitor and a printer. An input/output (I/O) device is also connected to the lithographic projection apparatus for handling control signals transmitted to and received from actuators and sensors, which take part in controlling of the projection system PL in accordance with the present invention.

As explained previously, when the projection beam radiation PB passes through the projection lens system PL, part of it is absorbed in lens elements and coating materials. This partial absorption causes global and local temperature and refractive index changes in the lens elements. This results in changes in the optical performance of the lens, which can be characterized as lens aberration. The overall aberration can be decomposed into a number of different types of aberration, such as spherical aberration, astigmatism and so on. The overall aberration is the sum of these different aberrations, each with a particular magnitude given by a coefficient. Aberration results in a deformation in the wave front and different types of aberration represent different functions by which the wave front is deformed. These functions may take the form of the product of a polynomial in the radial position r and an angular function in sine or cosine of $m\theta$, where r and $\theta$ are polar coordinates and m is an integer. One such functional expansion is the Zernike expansion in which each Zernike polynomial represents a different type of aberration and the contribution of each aberration is given by a Zernike coefficient, as will be described in more detail below.

Particular types of aberration, such as focus drift and aberrations with even values of m (or m=0) in the angular functions dependent on $m\theta$, can be compensated for by way of image parameters for effecting adjustment of the apparatus in such a manner as to displace the projected image in the vertical (z) direction. Other aberrations, such as coma, and aberrations with an odd value of m can be compensated for by way of image parameters for effecting adjustment of the apparatus in such a manner as to produce a lateral shift in the image position in the horizontal plane (the x,y-plane).

The best-focus (BF) position, i.e. z-position of the image, can be measured using the actual lithographic projection apparatus. The best-focus position is the z-position with maximum contrast, for example the position as defined by the maximum of a sixth-order polynomial fit to the contrastversus-position curve as the position is moved from defocus, through focus and on to defocus. The best-focus can be determined experimentally using known techniques, such as the technique known as "FOCAL" (described below); alternatively, one may directly measure the aerial image, for example by using a transmission image sensor (TIS) (described below) or commercial focus monitor.

FOCAL is an acronym for focus calibration by using alignment. It is a best-focus measurement technique for completely determining information about the focal plane using the alignment system of the lithographic apparatus. A special, asymmetrically segmented alignment mark is imaged through focus on to a resist coated wafer. The position of this imaged mark (latent or developed) can be measured by the alignment system. Due to the asymmetric segmentation, the position measured by the alignment system will depend on the defocus used during exposure, thus allowing determination of the best-focus position. By distributing these marks over the whole image field and using different orientation for the segmentation, the complete focal plane for several structure orientations can be measured. This technique is described in more detail in U.S. Pat. No. 5,674,650 incorporated herein by reference.

One or more transmission image sensors (TIS) can be used to determine the lateral position and best focus position (i.e. horizontal and vertical position) of the projected image from the mask under the projection lens. A transmission image sensor (TIS) is inset into a physical reference surface associated with the substrate table (WT). To determine the position of the focal plane, the projection lens projects into space an image of a pattern provided on the mask MA (or on a mask table fiducial plate) and having contrasting light and dark regions. The substrate stage is then scanned horizontally (in one or preferably two directions, e.g. the x and y directions) and vertically so that the aperture of the TIS passes through the space where the aerial image is expected to be. As the TIS aperture passes through the light and dark portions of the image of the TIS pattern, the output of the photodetector will fluctuate (a Moiré effect). The vertical level at which the rate of change of amplitude of the photodetector output is highest indicates the level at which the image of TIS pattern has the greatest contrast and hence indicates the plane of optimum focus. The x, y-positions of the TIS aperture at which the rate of change of amplitude of the photodetector output during said horizontal scan is highest, are indicative of the aerial lateral position of the image. An example of a TIS detection arrangement of this type is described in greater detail in U.S. Pat. No. 4,540,277 incorporated herein by reference.

The measurement of other imaging parameters is described in U.S. Pat. No. 6,563,564.

Other techniques can also be used to analyze the image. For example, a so-called ILIAS sensing arrangement as described in WO 01/63233 may be used.

From these measurements of the image position, it is possible to obtain the Zernike coefficients of the different forms of aberration. This is explained more fully in, for example, European Patent Application No. EP 1128217A2 incorporated herein by reference.

The lens heating effect is also in general dependent on parameters such as the illumination setting, mask transmission, mask structure, field size and shape, light intensity, wafer reflectivity and wafer layout, so it is difficult to calculate from first principles and is generally empirical. The lens heating effect also varies dynamically with time, and so, in order to correct for this lens heating effect, the present embodiment employs a model of the effects of lens heating based on previous measurements, optionally calibrates and fine tunes the model using intermittent measurements, and makes adjustments to the lithographic projection apparatus to keep the lithographic parameters within their respective tolerances.

Considering the aberration effect known as focus drift caused by lens heating, the model employed in the preferred embodiment is as follows.

$$F(t)=A_1(1-e^{-1/t1})+A_2(1-e^{-1/t2})$$

Thus the drift F as a function of time t, i.e. the change in best focus position in the z-direction relative to its position at t=0, is described by two exponential functions and this has been found to be a good model. Each of the exponential functions has a time-constant, $\tau_1$ and $\tau_2$ respectively, and each has an amplitude, $A_1$ and $A_2$ respectively. The values of the amplitudes and time constants depend on at least a subset of the parameters of illumination setting, mask transmission, mask structure, field size and shape, radiation intensity, wafer reflectivity and wafer layout. The model of this embodiment further assumes a linear dependency of the amplitudes on some of these parameters, and particularly those proportional to the power incident on the lens, such as the light intensity, field size, mask transmission factor and wafer reflectivity, such that the amplitudes may be written as:

$$A_1=\mu_1 \cdot T_r \cdot S \cdot I \cdot W_{refl}$$

$$A_2=\mu_2 \cdot T_r \cdot S \cdot I \cdot W_{refl}$$

where I is the exposure light intensity (W/m$^2$), S is the field size or masking area at wafer level (m$^2$), $T_r$ is the mask transmission factor, $W_{refl}$ is the wafer reflectivity (a pure fraction or percentage), and $\mu_{1,2}$ are so-called scaling factors, which are phenomenological and depend on all the other parameters that affect lens heating but that are not specifically included.

In this way, a lens heating database is built up which stores the image parameter values needed to correct for lens heating, and which in this embodiment consists of two time constants ($\tau_1$ and $\tau_2$) and two scaling factors ($\mu_1$ and $\mu_2$). A set of these image parameters can be stored for each mask and illumination setting of interest.

The technique has been described above in terms of focus drift purely as an example of one type of image parameter. Sets of image parameters can also be built up and stored in the database that characterize the change in different aberrations, such as astigmatism and coma, as a function of lens heating (time). The aberrations may depend strongly on the particular mask structure being exposed, and therefore fine tuning measurements can be made using a particular mask to obtain values of these image parameters for different aberrations prior to exposing a particular lot of wafers using that mask. Any mask-specific mask heating effects can also be included in the model.

Having obtained and installed a database of parameters defining the lens heating effect, software is used in a feed forward technique to predict the necessary correction that needs to be made to overcome the effects on image parameters of the aberrations calculated according to the model. This is done for every exposure, and physical adjustments to compensate for the calculated image parameter offsets that need to be corrected are preferably made immediately before each exposure.

To compensate for variations in heating effects between different masks and at different illumination settings for which fine-tuned parameters have not necessarily been obtained, occasional measurements can also be made intermittently during a lot to dynamically adjust the model. New optimum time constant and/or scaling factor parameters can be calculated after each new measurement by a fit based on for instance a minimization of the residue R. Also, when performing exposures at settings for which parameter values are not available, interpolation or extrapolation from known parameters can be used to give a best estimate for the parameter values to be used for the new setting.

At a particular time, a calculation for each type of aberration effect will give the predicted additional amount of that aberration effect resulting from lens heating, over and above any intrinsic aberration effect, i.e. the default value for the lens. The correction to make to the lithographic projection apparatus in terms of adjustments to be made to the apparatus by way of adjustment signals to further compensate for the lens heating effect depends on each particular type of aberration or image parameter as follows:

Focus drift—adjust substrate table height
   Field curvature—shift one or more movable lens elements along the optical axis
   Magnification drift—shift one or more movable lens elements along the optical axis and adjust axial position of mask along the optical axis
   Third-order distortion—adjust axial position of mask along the optical axis and shift one or more movable lens elements along the optical axis
   Spherical aberration—shift one or more movable lens elements along the optical axis
   Comatic aberration—shift the central wavelength of the exposure radiation and adjust the degree of decentering with respect to the optical axis of one or more movable lens elements.

It should be noted that the relationships between the aberrations and the required adjustments to the lithographic projection apparatus may differ for different types of lens.

The correction can be performed automatically by the machine, based on tabulated or calculated image parameter values relating the magnitude of the aberration effect to the size of the mechanical adjustment necessary. Saddle-like deformation of one or more lens elements to correct for particular aberrations is described, for example, in WO 99/67683 incorporated herein by reference.

The contribution of each aberration effect will depend on the mask being exposed and the illumination setting. Therefore it will not always be necessary to make adjustments for all of these aberration effects for every exposure or lot of exposures.

The projection system PL is provided with an actuating device AD which is capable of adapting the optical settings of the projection system by way of adjustment signals supplied to the optical elements within the projection system PL in accordance with the calculated image parameters. The actuating device AD is provided with input and output ports for exchanging control signals with the computer arrangement.

Figure 3:
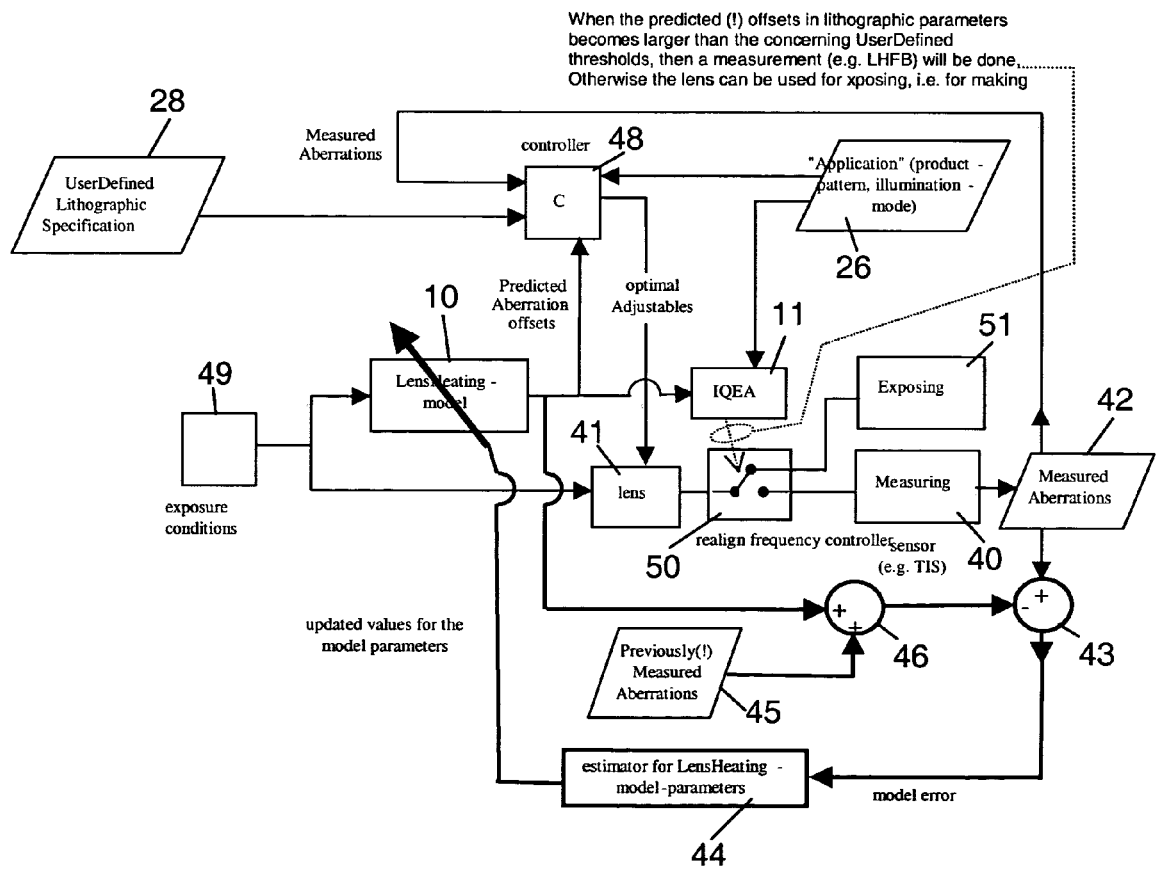
FIG. 3 is a functional diagram of a preferred embodiment of the invention using a lens heating model and an IQEA model.
Figure 4:
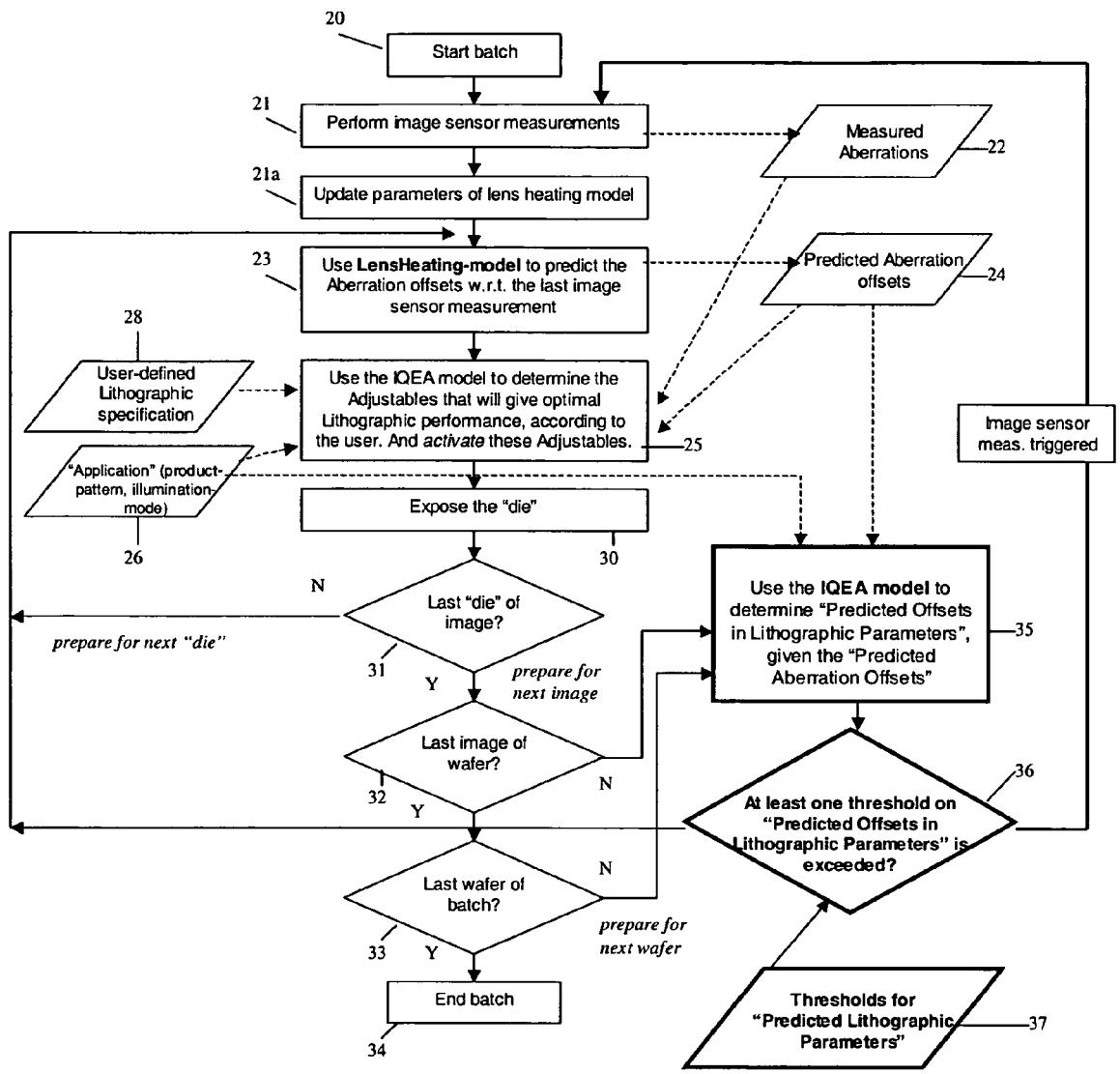
FIG. 4 is a flow chart of the control steps to be carried out in implementing the preferred embodiment.

The computer arrangement is used to manipulate data using a combination of a lens heating model and an IQEA model (where IQEA denotes image quality effects of aberrations), as shown in the explanatory diagram of FIG. 3. The lens heating model (which may be, for example, as described in U.S. Pat. No. 6,563,564) is a dynamic model which predicts changes in the aberrations, that is the aberration offset data, with time due to heating of the lens, and which receives as input data indicative of the particular application, such as the product pattern, the illumination mode, etc., as well as data indicative of the exposure history, that is the data indicative of the timestamp, dose, image size, reticle transmission, etc. of each of the exposures that have previously been carried out in the lot, and the current time. The lens heating model provides aberration offset output signals (expressed in Zernikes). The IQEA model also receives data indicative of the particular application (product pattern, illumination mode) and the user-defined lithographic specification, as well as aberration offset data indicative of the predicted aberration changes from the lens heating model, and provides output signals indicative of the image parameter offsets, such as distortions in the X-Y plane, deviations in the Z plane, and offsets in other image parameters, e.g. astigmatism. Such image parameter offset output signals effect the required adjustments to compensate for the aberrations of most relevance to the particular application, such adjustments being effected by way of adjustment signals supplied to one or more lenses of the projection system, and/or other adjustable parts of the apparatus, such as the substrate table, depending on the aberrations to be compensated for to optimize the overlay and imaging performance of the lithographic projection apparatus. Such image parameter offset output signals will vary with time by virtue of the fact that the aberration values outputted by the lens heating model will vary with time, and may serve to adjust for distortions in the XY-plane, deviations in the Z-plane normal to the XY-plane, or to adjust for offsets in more general imaging parameters, e.g. on-axis astigmatism. Other image parameter output signals may serve to adjust the CD or L1L2 for example.

The lens heating model and the IQEA model are combined with. a lens model and an optimizer. The lens model (not to be confused with the lens heating model) provides an indication of the setting of the various lens adjustment elements that will give optimal lithographic performance for the particular lens arrangement used as will be described in more detail below, and can be used together with the IQEA model (and the predicted aberration offsets from the lens heating model) to optimize the overlay and imaging performance of the lithographic apparatus during exposure of a lot of wafers. To this end the predicted image parameter offsets (overlay, focus, etc) from the IQEA model are supplied to the optimizer which determines the adjustment signals for which the remaining offsets in the image parameters will be minimized according to the user-defined lithographic specification (which will include for example the relative weighting to be allotted to overlay errors and focus errors and will determine to what extent the maximum allowed value for the overlay error (dX) over the slit for example will be counted in the merit function indicating optimal image quality as compared with the maximum allowed value for the focus error (dF) over the slit). The parameters of the lens model are calibrated off-line.

During an optimization phase the adjustment signals are supplied by the optimizer to the lens model which determines the aberrations that would be induced in the lens if such adjustment signals were supplied to the lens. These induced aberrations are supplied to an adder along with the predicted aberrations offsets from the lens heating model and any measured aberration values; such that only the remaining aberrations are fed back to the IQEA model. The measured aberration values are supplied as a result of the previously described measurements at the start of the lot, and the aberration offsets with respect to the last measured values are predicted by the lens heating model. Following such optimization of the image parameters, the resultant adjustment signals are supplied to the lens or other adjustable element to effect the necessary compensating adjustments prior to exposure of the wafers.

The overall aberration can be decomposed into a number of different types of aberration, such as spherical aberration, astigmatism and so on. The overall aberration is the sum of these different aberrations, each with a particular magnitude given by a coefficient. Aberration results in a deformation in the wave front and different types of aberration represent different functions by which the wave front is deformed. These functions may take the form of the product of a polynomial in the radial position r and an angular function in sine or cosine of mθ, where r and θ are polar coordinates and m is an integer. One such functional expansion is the Zernike expansion in which each Zernike polynomial represents a different type of aberration and the contribution of each aberration is given by a Zernike coefficient:

$$W(\rho, \theta) = \sum_{n=0}^{N} \sum_{\substack{l=-n \\ step\ 2}}^{n} A_{n,l} \cdot R_n^l(\rho) \cdot e^{i \cdot l \cdot \theta} \quad (1)$$

where
W is the phase distribution in the pupil plane, as function of position in the pupil [nm]
$A_{n,l}$ is the aberration or Zernike coefficient [nm]
$R_n^l$ is a polynomial of order n, and dependent on l.
ρ is the radius in the pupil plane [units of NA]
θ is the angle in the pupil [rad]
n is the power of ρ ($0 \leq n \leq N$)
N is the order of the pupil expansion
l is the order of θ (n+l=even and $-n \leq l \leq n$)
The aberration coefficient $A_{n,l}$ is usually written as Zernike coefficient $Z_i$:

$$A_{n,l} = a_i \cdot Z_i, \quad (2)$$

where
$a_i$ is a scaling factor
i is $n^2+n+l+1$

The aberrations and thus also the Zernike coefficients are a function of the position in the image plane: $Z_i=Z_i(X,Y)$. However, in a scanner the aberrations in the y-direction are averaged out during the scanned exposure, so that $Z_i(X,Y)$ becomes $\bar{Z}_i(X)$ (which is usually just referred to as $Z_i(X)$).

The function of the aberrations (Zernike coefficient) across the image plane can in turn be described by a simple series expansion:

$$Z_i(X) = Z_{i\_0} + Z_{i\_1} \cdot X + Z_{i\_2} \cdot X^2 + Z_{i\_3} \cdot X^3 + Z_{i\_res}(X), \quad (3)$$

where $Z_i(X)$ is described as the sum of a constant term (with coefficient $Z_{i\_0}$), a linear term (with coefficient $Z_{i\_1}$), etc. and a remaining term or residuals ($Z_{i\_res}$).

The linear and third order terms of the low order odd aberrations ($Z_{2\_1}$, $Z_{2\_3}$) are referred to as the magnification and third order distortion. However, there are also for instance linear terms of higher order odd aberrations (eg. $Z_{7\_1}$ or coma tilt) which have a magnification effect (but depending on the exposed image, illumination setting and mask type). The second order of the lower order even aberration ($Z_{4\_2}$) is usually referred to as the field curvature.

The lens model is used to calculate the lens settings (adjustable lens element positions and tilts) that give optimal lithographic performance. For instance the lens of one particular system is able to adjust the following parameters: $Z_{2\_1}$, $Z_{2\_3}$, $Z_{4\_2}$, $Z_{7\_1}$, $Z_{9\_0}$, $Z_{14\_1}$, $Z_{16\_0}$ The following equations represent a simplified example of the lens model:

$$Z_{2\_1} = A^*E1 + B^*E2 + C^*E3$$

$$Z_{7\_1} = D^*E1 + F^*E2 + G^*E3$$

$$Z_{9\_0} = H^*E1 + K^*E2 + N^*E3$$

$$Z_{14\_1} = P^*E1 + Q^*E2 + R^*E3 \quad (4)$$

or in matrix notation:

$$\bar{Z}_{adj} = \begin{pmatrix} Z_{2\_1} \\ Z_{7\_1} \\ Z_{9\_0} \\ Z_{14\_1} \end{pmatrix} = \begin{pmatrix} A & B & C \\ D & F & G \\ H & K & N \\ P & Q & R \end{pmatrix} \cdot \begin{pmatrix} E1 \\ E2 \\ E3 \end{pmatrix} = M \cdot \bar{E} \quad (5)$$

where M is the dependencies matrix and $\bar{E}$ is the lens element vector

A simulator uses the IQEA model to determine, from the characteristics of the product features and the illumination settings used, the so-called sensitivities ($S_i$) for the different aberration coefficients ($Z_i$) and these sensitivities constitute the linearised IQEA_model. This is done by using commercial packages, such as Prolith, Solid-C or Lithocruiser (from ASML Masktools), that are able to calculate the projected aerial image based on the characteristics of the feature, the illumination setting, and the lens type and aberrations. From the aerial image the relevant lithographic errors can be calculated, such as X-displacement (the distribution of X- and Y-displacement errors being usually referred to as distortion), Z-displacement (called defocus and the distribution of Z-displacement errors being usually referred as focal plane deviation), C-D difference (critical dimension difference for brick-wall features), left-right asymmetry, H-V litho errors, etc. The sensitivities are calculated by dividing the calculated error by the amount of aberration put into the simulator. This is done for all the relevant lithographic errors and aberrations (expressed in Zernikes).

By multiplying the calculated sensitivities by the aberrations of the lens, the lithographic errors of the system are obtained across the image field (scanner slit). For example, an overlay error is the X-distortion (dx), and the X-distortion of a certain feature exposed with a certain illumination setting becomes:

$$dx(X) = \sum_i Z_i(X) \cdot S_i \quad (i = 2, 7, 10, 14, 19, 23, 26, 30\ and\ 34). \quad (6)$$

And the defocus (dF) across the slit (for a vertical feature) becomes:

$$dF(X) = \sum_i Z_i(X) \cdot S_i \quad (7)$$

(i = 4, 5, 9, 12, 16, 17, 21, 25, 28, 32 and 36).

Depending on the user defined lithographic specification, other lithographic errors also need to be taken into account. In general most lithographic errors can be written as:

$$E(X) = \sum_i Z_i(X) \cdot S_i \ (i = 2, 3, \ldots 36). \quad (8)$$

If the lens model is used without also applying the IQEA model, all the aberrations (in this example $Z2\_1$, $Z7\_1$, $Z9\_0$ and $Z14\_1$) are optimised at the same time. Because there are less lens elements to adjust than there are parameters to optimise, the total system may be placed in the optimum state but the individual image parameters may not be optimal for the particular application. Furthermore the optimal state for all tunable parameters together might not give the optimal performance.

By combining the IQEA model with the lens model, it is possible to make the correction method much more flexible and powerful (it can be optimised for the appropriate applications).

Two possible methods for combining the lens model and the IQEA model are discussed below: The simplest method for combining the two models is by applying the calculated sensitivities ($S_i$) from the IQEA model in the lens model:

$$\overline{Z}'_{adj} = \begin{pmatrix} Z'_{2\_1} \\ Z'_{7\_1} \\ Z'_{9\_0} \\ Z'_{14\_1} \end{pmatrix} = \begin{pmatrix} Z_{2\_1} \cdot S_2 \\ Z_{7\_1} \cdot S_7 \\ Z_{9\_0} \cdot S_9 \\ Z_{14\_1} \cdot S_{14} \end{pmatrix} \quad (9)$$

$$= \begin{pmatrix} A \cdot S_2 & B \cdot S_2 & C \cdot S_2 \\ D \cdot S_7 & F \cdot S_7 & G \cdot S_7 \\ H \cdot S_9 & K \cdot S_9 & N \cdot S_9 \\ P \cdot S_{14} & Q \cdot S_{14} & R \cdot S_{14} \end{pmatrix} \cdot \begin{pmatrix} E1 \\ E2 \\ E3 \end{pmatrix} = M' \cdot \overline{E}$$

If for example $S_{14}=0$, the equations become exactly solvable. However, even if none of the sensitivities is zero, the highest sensitivities will get more weight in the final solution, resulting in an state of the system which is optimal for the particular application.

The second method for combining the two models is to optimise the system to one or more lithographic performance indicators. In one possible example the system is optimised for the performance indicator X-distortion (dx) in which case the IQEA model equation for this indicator can be written in the following manner:

$$dx(X) = \sum_i Z_i(X) \cdot S_i \quad (10)$$

$$= \sum_i (Z_{i\_0} + Z_{i\_1} \cdot X + Z_{i\_res}(X)) \cdot S_i$$

$$= \sum_i Z_{i\_1} \cdot S_i \cdot X + \sum_i (Z_{i\_0} + Z_{i\_res}(X)) \cdot S_i$$

$$= (Z_{2\_1} \cdot S_2 + Z_{7\_1} \cdot S_7 + Z_{14\_1} \cdot S_{14}) \cdot X +$$

$$\sum_r Z_{r\_1} \cdot S_r \cdot X + \sum_i (Z_{i\_0} + Z_{i\_res}(X)) \cdot S_i$$

$$= (Z_{2\_1} \cdot S_2 + Z_{7\_1} \cdot S_7 + Z_{14\_1} \cdot S_{14}) \cdot X + \text{residuals})$$

where i=2, 7, 10, 14, 19, 23, 26, 30 and 34 and r=10, 19, 23, 26, 30 and 34

If the expressions for the lens adjustments are used for the three linear aberration terms ($Z_{2\_1}$, $Z_{7\_1}$, $Z_{14\_1}$) in this equation, it becomes:

$$dx(X) = (Z_{2\_1} \cdot S_2 + Z_{7\_1} \cdot S_7 + Z_{14\_1} \cdot S_{14}) \cdot X + \text{residuals} \quad (11)$$

$$= (A \cdot E1 + B \cdot E2 + C \cdot E3) \cdot S_2 +$$

$$(D \cdot E1 + F \cdot E2 + G \cdot E3) \cdot S_7 +$$

$$(P \cdot E1 + Q \cdot E2 + R \cdot E3) \cdot S_{14} + \text{residuals}$$

This equation constitutes the integrated lens model equation which needs to be solved. In this solution the lens element positions (E1, E2 and E3) need to be found for which dx(X) becomes minimal (which will be very simple since there are three variables (lens elements) and only one equation). In reality there will be more lithographic errors that have to be optimised at the same time, making the solution more complex. For instance, if there is a requirement to optimise the defocus (dF), the second equation to be solved becomes:

$$dF(X) = Z_{9\_0} \cdot S_9 + \text{residuals} \quad (12)$$

$$= (H * E1 + K * E2 + N * E3) \cdot S_9 + \text{residuals}$$

In this case both dx and dF need to become minimized by adjusting the lens elements.

In cases where there are an excess number of degrees of freedom, it is sensible to use this to make individual adjustable aberrations as small as possible, in order to make the general performance of the system as good as possible.

Figure 2:
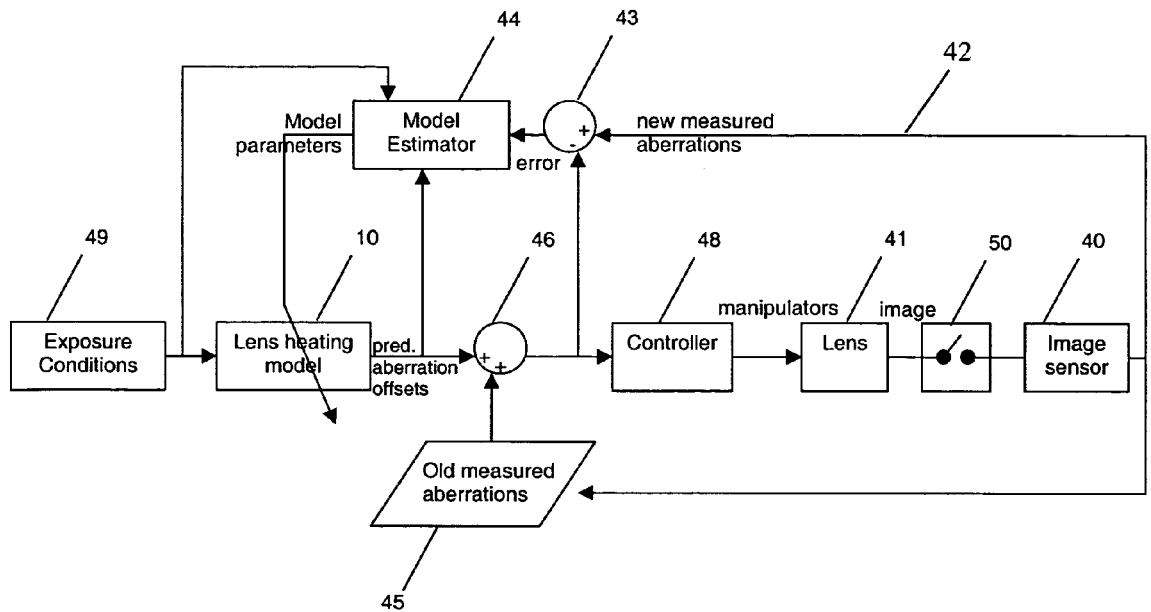
FIG. 2 is an explanatory diagram of a preferred embodiment of the invention.

FIG. 2 is a diagram illustrating the basic control feedback process used in a practical implementation of the invention. During production, measurements are performed on each wafer by an image sensor 40 under the control of a realign frequency controller 50 in order to measure the aberrations of the lens 41 of the projection system. The resultant measured aberration data values 42 are fed back by way of a feedback control system to the lens heating model 10 by way of an adder 43 and a model estimator 44 for estimating model parameters to be supplied to the model 10 based upon the measured aberration data values, previously measured aberration data values 45 and the current predicted aberration offsets supplied to a further adder 46. This results in a model error related to the difference between the measured aberration data values and the predicted aberration values with respect to previously measured aberration values. The lens heating model 10 also receives the exposure history from an exposure memory 49.

The output from the adder 46 is supplied to a controller 48 for supplying optimized adjustment signals to the lens 41 with the object of providing optimized compensation of the lens aberrations. When the predictive aberration offset becomes larger than a user defined threshold value, the realignment frequency controller 50 triggers a measurement. Other than when such a measurement is being undertaken, however, the lens is available for exposing of the product, and accordingly the amount of time available for product exposure is maximized.

The sequence of control operations required to be carried out in a typical implementation of the embodiment of the invention for sequentially exposing the wafers in a batch of wafers, and for carrying out a sequence of multiple die exposures for each wafer, will now be described with reference to Figure. In this implementation the computer arrangement is capable of controlling and adjusting the settings of the projection system in such a way that, during each exposure in the sequence of multiple die exposures for each wafer, the changes in the aberrations due to lens heating which the particular application is most sensitive to are compensated for optimally for the exposure of each successive die of each wafer.

Therefore, at the start of the exposure of the batch of wafers as indicated by the start batch box 20, a batch correction procedure 21 is performed in which, prior to the sequence of exposures of the batch, the aberrations of the image are measured, for example by the ILIAS or TIS technique, to provide measured aberration data 22, and to supply update parameters 23 to the lens heating model. The resulting aberration values are supplied to the IQEA model as described in more detail below. The lens heating model is then used in a processing step 23 to predict the aberration offset data 24 due to lens heating for each successive exposure, the lens heating model receiving data indicative of the exposure history (e.g. the number of earlier exposures in the lot, and their time stamps). Such aberration offset prediction is performed for each successive exposure in the batch on the basis of predicted changes in the aberrations with respect to the last batch correction in advance of actual exposure.

In a processing step 25 the IQEA model receives measured aberration data 22 and the aberration offset data 24, as well as the application data 26, that is the data indicative of the particular application, such as the illumination mode (e.g. numerical aperture, sigma inner and outer), the features to be defined in the product with high accuracy (e.g. feature size, density), the dose of radiation to be applied during the exposure, the mask transmission, etc., and data 28 indicative of the user defined lithographic specification defining the sensitivities of different features to different aberration types. The IQEA model, together with an appropriate optimizer, determines from this data the modeled image parameter offsets for adjustment of the appropriate settings, such as OVL values (X-Y adjustment), FOC values (Z adjustment), for optimising the imaging performance for each exposure as will be described below. The appropriate die on the wafer is then exposed with these settings in a processing step 30, and it is determined at 31 whether or not the last die of the image has been exposed, and a control signal is transmitted to initiate the processing step 23 for the next die of the image where appropriate. In the event that all the dies of the image have been exposed, it is determined at 32 whether or not the last image of the wafer has been exposed, and a control signal is transmitted to initiate the series of processing steps 23 for the next image where appropriate. In the event that all the images of the wafer have been exposed, it is determined at 33 whether or not the last wafer of the batch has been exposed, and a control signal transmitted to signal the end of the exposure of the batch of wafers, as indicated at 34.

At certain stages during this sequence of operations an alignment or realignment procedure is performed in which the positions of four alignment markers on the mask are detected, and, in the event that one or more of the image parameter offsets exceeds a threshold with respect to a reference value, some of the image parameters, such as the magnification for example, are remeasured with the result that these particular image parameters will be measured more frequently than just once at the start of a lot. This realignment is an example of a feedback control system. Since such realignment is done on markers on the mask (or, in the case of a batch correction used in an alternative feedback control system, from markers on the reticle stage), which are separate from the product pattern, care must be taken to ensure that the remaining aberrations do not adversely affect measurement of the markers during such realignment. In this regard the IQEA model can be used to predict the image parameter offsets that are of most relevance to the detection of the markers on the mask in order to enable the corresponding aberrations to be compensated for so that they do not adversely affect measurement of the markers during the realignment.

Furthermore a lens heating feedback control system is provided in which the predicted aberration offset data 24 and application data 26 are inputted into the IQEA model in a feedback processing step 35 so that, prior to the exposure of a further image on a wafer or a further wafer, the predicted image parameter offsets are compared at 36 to threshold data held at 37. In the event that one or more of the image parameter offset values exceeds the corresponding threshold value, the realignment procedure is initiated by way of a feedback control signal that causes the aberrations of the image to be remeasured in a further measurement step, so that such newly measured aberration values are used in determination of the total aberration values to be used in the calculation of the image parameter offsets for controlling the optimal lens settings for the exposure of the next image or wafer, in place of the previously measured aberration values. The exposure of each image on each wafer is controlled in similar manner with the optimal lens settings being adjusted for each image where necessary to take account of further heating of the lens, and realignment (by remeasurement of the aberrations) occurring only when necessary as determined by the predicted image parameter offsets exceeding the threshold values.

Figure 5:
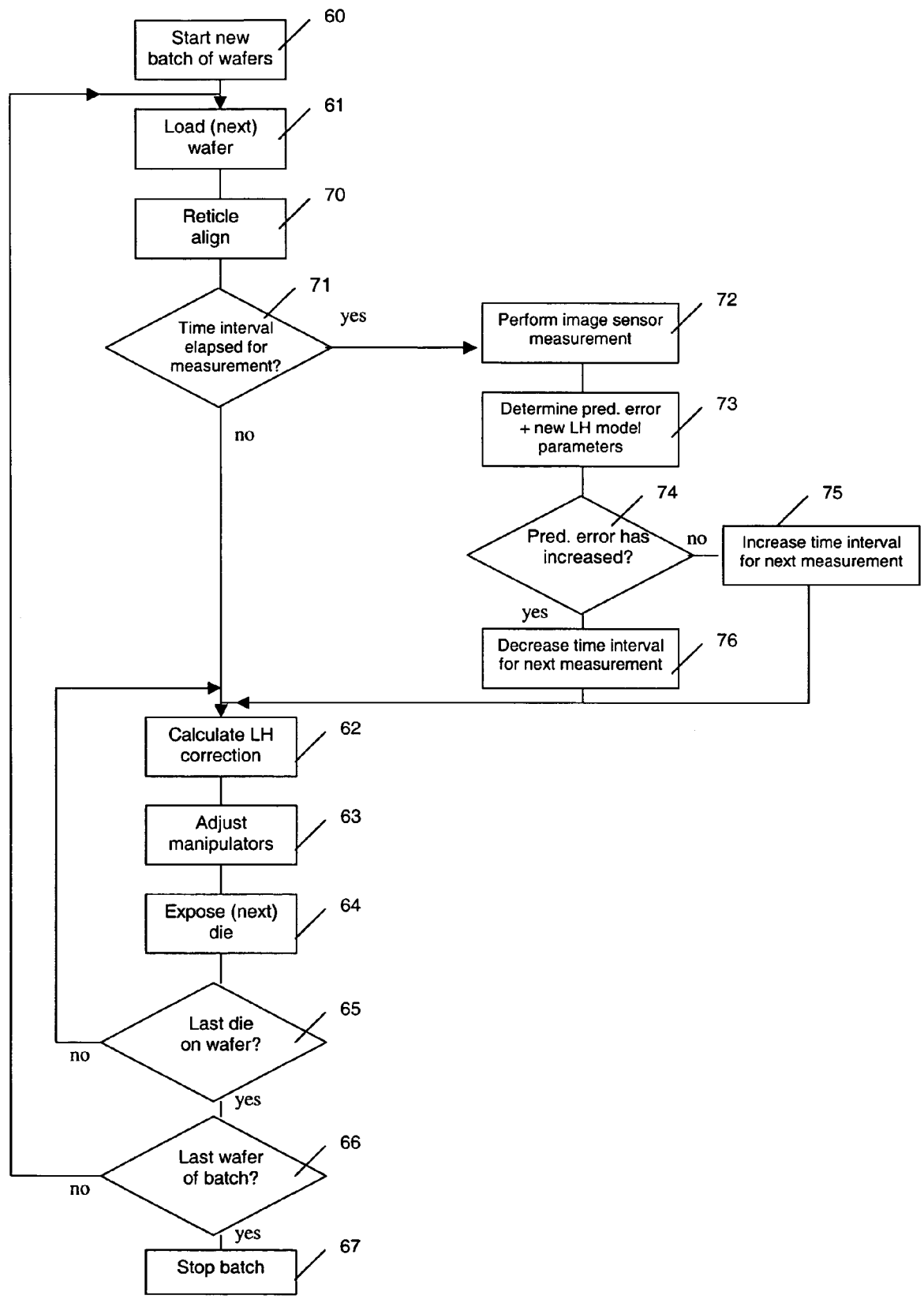
FIG. 5 is a flow chart of the control steps to be carried out in implementing adaptive inline lens heating calibration with smart realign in one embodiment of the invention.

FIG. 5 diagrammatically illustrates the sequence of control operations required to be carried out in an adaptive inline lens heating calibration arrangement incorporating a controlled realignment procedure. As previously described the computer arrangement is capable of controlling and adjusting the settings of the projection system in such a way that, during each exposure in the sequence of multiple die exposures for each wafer, the changes in the aberrations due to lens heating which the particular application is most sensitive to are compensated for optimally for the exposure of each successive die of each wafer.

At the start of the exposure of the batch of wafers as indicated by the start batch box 60, a wafer is loaded at 61 into the exposure zone and a reticle alignment procedure 70 is performed as described above. At 71 it is determined whether a threshold time interval has elapsed since the last measurement of the aberrations of the image. In the event that the time interval that has elapsed since the last measurement is less than this threshold value, the calculation of the lens heating model correction 62 is proceeded with on the basis of the existing values prior to exposure. However, in the event that the time interval that has elapsed since the last measurement is equal to or greater than the threshold value, the aberrations of the image are measured at 72, for example by the ILIAS or TIS technique, with the object of providing newly measured aberration values for supply to the lens heating model. At 73 the error in the predicted aberration values relative to the newly measured aberration values is determined and the new lens heating model parameters are produced. It is then determined at 74 whether this error has increased or decreased relative to the error determined at the time of the last measurement, and, in the event that the error has increased, the threshold value for the purposes of the control of the lens heating model parameters to be used for the exposure of the next wafer is decreased at 76. In the event that the error has decreased relative to the error determined at the time of the last measurement, the threshold value for the exposure of the next wafer is increased at 75.

The calculation of the lens heating model correction 62 is then proceeded with on the basis of the relevant input values, and the resulting aberration values are supplied to the IQEA model at 63 for determination of the image parameter offsets for adjustment of the appropriate settings for the exposure. The appropriate die on the wafer is then exposed with these settings in a processing step 64, and it is determined at 65 whether or not the last die on the wafer has been exposed, a control signal being transmitted to initiate the processing step 62 for the next die on the wafer where appropriate. In the event that all the dies on the wafer have been exposed, it is determined at 66 whether or not the last wafer of the batch has been exposed, a control signal being transmitted to initiate the series of processing steps for the next wafer where appropriate. In the event that all the dies on the wafer have been exposed, a control signal is transmitted to signal the end of the exposure of the batch of wafers, as indicated at 67. The exposure of each image on each wafer is controlled in similar manner with the optimal lens settings being adjusted for each image where necessary to take account of further heating of the lens, and realignment (by remeasurement of the aberrations) occurring only when necessary.

Figure 6:
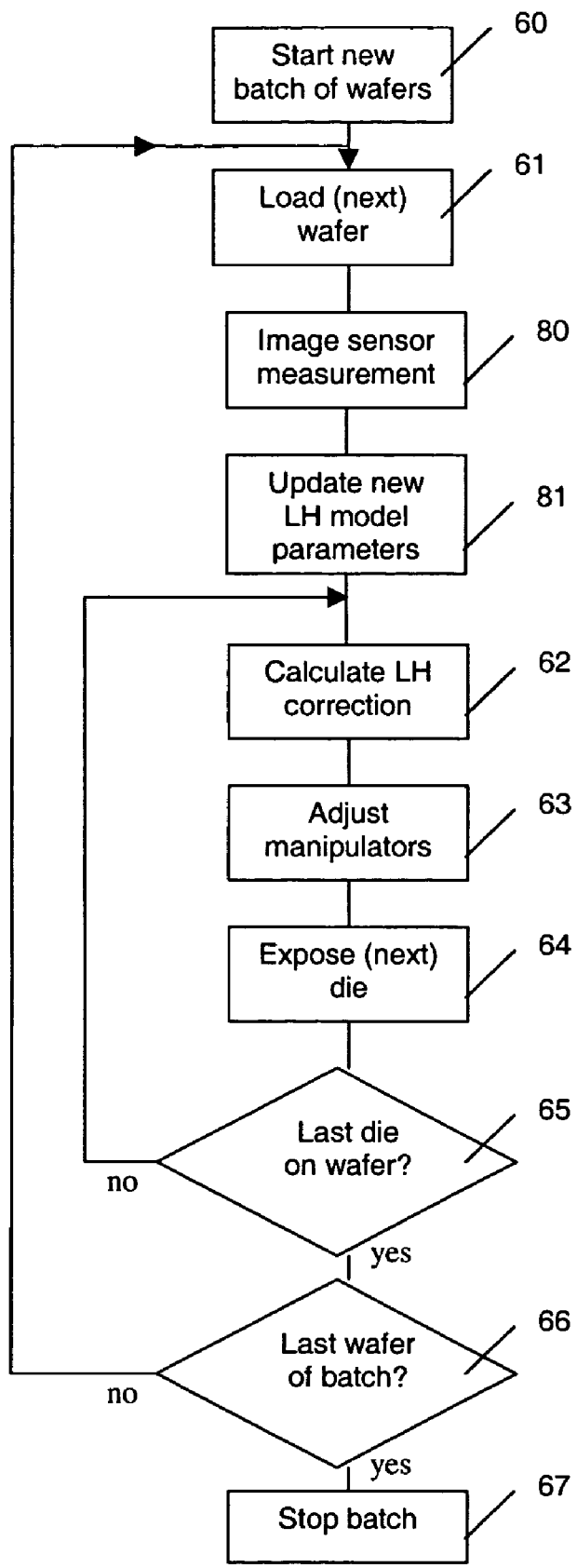
FIG. 6 is a flow chart of the control steps to be carried out in implementing adaptive inline lens heating calibration without smart realign in another embodiment of the invention.

FIG. 6 diagrammatically illustrates the sequence of control operations required to be carried out in an adaptive inline lens heating calibration arrangement that does not incorporate a controlled realignment procedure. As in the previously described arrangement a wafer is loaded at 61 into the exposure zone at the start of the exposure of the batch of wafers as indicated by the start batch box 60. In this case, however, instead of the controlled realignment procedure previously described, a separate measurement is made at 80 for each wafer, for example by the ILIAS or TIS technique, and the new lens heating model parameters are produced at 81. The calculation of the lens heating model correction 62 is then proceeded with as before, and the resulting aberration values are supplied to the IQEA model at 63 for determination of the image parameter offsets for adjustment of the appropriate settings for the exposure. The control of the exposure of each die on each wafer is then proceeded with in the manner previously described. The exposure of each image on each wafer is controlled in similar manner with remeasurement of the aberrations taking place automatically prior to the exposure of each wafer, rather than only when necessary as in the previously described arrangement.

FIG. 3 is a diagram showing the manner in which the control feedback process is implemented in the preferred embodiment of the invention incorporating a controlled realignment procedure. During production (customer conditions), measurements are performed on each wafer of a batch (or at least on certain wafers) using a measuring system 40 incorporating a sensor for measuring the aberrations of the lens 41 of the projection system, these measurements being either TIS and/or ILIAS measurements. Measured aberration data values 42 obtained are fed back by way of a feedback control system to the lens heating model 10 by way of an adder 43 and an estimator 44 for estimating model parameters to be supplied to the model 10 based upon the measured aberration data values 42, previously measured aberration data values 45 and the current predicted aberration offsets supplied to a further adder 46. This results in a model error related to the difference between the measured aberration data values and the predicted aberration values with respect to previously measured aberration values.

Additionally the measured aberration data values are supplied to a controller 48 for supplying optimized adjustment signals to the lens 41 with the object of providing optimized compensation of the lens aberrations. The controller also receives data 28 indicative of the user defined lithographic specification defining the sensitivities of different features to different aberration types, and application data 26 indicative of the particular application, such as the illumination mode, the product features to be defined with high accuracy, the radiation dose, etc, as well as the predicted aberration offsets from the lens heating model 10.

Furthermore the lens heating model 10 receives the exposure history from an exposure memory 49 and supplies predicted aberration offsets to the IQEA model 11 which in turn controls a realign frequency controller 50 for controlling the frequency of realignment measurements performed by the measuring system 40 relative to the successive exposures of the product performed by the exposing system 51. When the predictive aberration offset becomes larger than a user defined threshold value, the realignment frequency controller 50 triggers a measurement. Other than when such a measurement is being undertaken, however, the lens is available for exposing of the product, and accordingly the amount of time available for product exposure is maximized.

In such an arrangement the feedback measurement frequency is based on the feedforward model feedback measurement error, and the measurements are used not only for aberration compensation (in a feedback control mechanism) but also to estimate the lens heating feedforward model parameters used for the current application. The feedback control mechanism enables the imaging performance to be kept within the required specification in spite of the use of an imperfect lens heating feedforward model.

Initially, during the calibration and measurement cycle of a particular lot of wafers, the model parameters supplied to the lens heating model 10 are default values, and the realign frequency at which measurements are performed by the measuring system 40 is controlled according to the realignment criterion that a measurement should be performed when the predicted drift is above the user defined threshold. When feedback data becomes available, the model error is used as a scheduling criterion for future realignments. Furthermore, when the model has become sufficiently accurate, that is when the model error is less than a certain predetermined limit value, the realignment frequency can be reduced. Thus, when there is a large system-model mismatch, more realignments are necessary in order to meet the imaging specification. The same data that is used for controlling the realignments is also used to refine the lens heating model, and, once the lens heating model is accurate enough, less realignments are needed. This results in an optimal trade-off between productivity and imaging performance.

In this manner the imaging and overlay performance of the apparatus is optimized for the particular application and to compensate for the effect of lens heating whilst ensuring that realignment, and the consequent decrease in throughput, occurs only when necessary. This is achieved by controlling the applied corrections according to the application and particularly in dependence on the features of the critical structures of the product, such as the gates of transistors in the front end layer of a wafer for example.

The procedure for these computations will be explained in more detail below. As a first step the lens aberrations measured for the projection system need to be described, for example in terms of Zernike coefficients.

A linear estimation computation model is used that implements an adaptation of projection system settings based on a linear combination of the sensitivities of the image to distortion with respect to all of the Zernike coefficients. Basically, a distortion of an ideal pattern feature with a given ideal centroid position will relatively shift the centroid position. For the different types of distortion as defined by the Zernike coefficients, the sensitivities of a given pattern feature to distortion will differ, but can be calculated based on a distortion map depending on a "co-ordinate by co-ordinate" or "slit co-ordinate" based approach.

Furthermore, the sensitivity to a given distortion type varies with the shape of the (basic) pattern feature to be imaged. Therefore the linear estimation computation model computes (for example in an off-line mode) the aberration induced distortion parameters for a variety of pattern features (variation of shape and size) in combination with the local lens aberrations of the projection system. Also, the illumination mode and mask type (i.e. the pupil plane filling) is taken into account.

Using the linear estimation computation model the distortion (dx, dy) on a co-ordinate (x, y) is described by:

$$dx(x, y) = \sum_{i=7,10,14,...} Z_i(x, y) \cdot S_i$$

$$dy(x, y) = \sum_{i=8,11,15,...} Z_i(x, y) \cdot S_i$$

where $Z_i$ is a Zernike coefficient of $i^{th}$ order, $S_i$ is a sensitivity coefficient for a given Zernike coefficient $Z_i$, with the x-distortion and the y-distortion each being described by a series of Zernike coefficients. The Zernike coefficients depend on the x, y coordinate. The sensitivities $S_i$ basically depend on the pattern, and the illumination mode.

The results of the computations of these equations are stored in the memory of the computer arrangement in one or more databases as imaging correction data. The imaging correction data can be determined for any given combination of pattern feature type and size, and pupil plane filling. The one or more databases may hold imaging correction data as a function of each of such combinations.

During the lithographic processing run, the imaging correction data is retrieved from the memory. The projection system settings are adapted in accordance with a combination of pattern distortion parameters, namely the type and size of the pattern feature to be imaged, the actual lens aberrations co-ordinate and the actual pupil plane filling for that pattern feature. The imaging correction data (based on the combination of actual pattern distortion parameters) can be made available from the database through information in the job data file for the processing run to an on-line adaptation procedure. The on-line adaptation procedure adapts, by way of I/O device, the projection system settings during the processing run in accordance with the imaging correction parameters for aberration induced distortion as given by equations.

Again, during the lithographic processing run, the combination of actual imaging correction parameters can be made available from the database through information in the job data file for the processing run to an on-line adaptation procedure. The on-line adaptation procedure adapts the projection system settings during the processing run in accordance with the imaging correction parameters for aberration induced distortion as given by the equations sets.

What is claimed is:

1. Lithographic projection apparatus comprising:
    a radiation system configured to provide a beam of radiation;
    a support structure configured to hold a patterning device, the patterning device capable of imparting a pattern to the beam;
    a substrate table configured to hold a substrate;
    a projection system configured to project the patterned beam onto a target portion of the substrate;
    a measurement system configured to measure changes in projection system aberrations with time;
    a predictive control system configured to predict variation of projection system aberrations with time on the basis of model parameters and to generate a control signal to compensate a time-varying property of the apparatus;
    an inline model identification system configured to estimate model parameter errors on the basis of projection system aberration values provided by the predictive control system and measured projection system aberration values provided by the measurement system; and
    an updating system configured to utilize the model parameter errors to update the model parameters of the predictive control system in order to maintain the time-varying property within acceptable performance criteria.

2. Lithographic projection apparatus according to claim 1, wherein a measurement timing system is provided to trigger measurements by the measurement system such that a time interval between measurements is increased if the model parameter error decreases, and the time interval between measurements is decreased if the model parameter error increases.

3. Lithographic projection apparatus according to claim 1, further comprising a comparator configured to compare the control signal to a threshold and to supply a realignment signal to a realignment system when the control signal exceeds the threshold in order to trigger further projection system aberration measurement, thereby providing updated measured aberration values.

4. Lithographic projection apparatus according to claim 3, wherein the comparator is adapted to compare the control signal to a threshold determined by a user-defined lithographic specification selected according to a particular imaging application.

5. Lithographic projection apparatus according to claim 1, wherein the measurement system is configured to measure changes in projection system aberrations with time during exposure of a lot of substrates and, when triggered to do so, to effect a further measurement at a certain time during the exposure of the lot of substrates, such measurements preferably being made after exposure of a current substrate and before the start of exposure of a subsequent substrate.

6. Lithographic projection apparatus according to claim 1, wherein a modelling system is provided to determine the application-specific effect of the predicted projection system aberration variation on one or more parameters of an image of a selected patterning device to be used in the apparatus to produce a specific required patterned beam.

7. Lithographic projection apparatus according to claim 6, wherein the modelling system is configured to store measurement history and exposure information history, for use in updating of the model parameters of the predictive control system.

8. Lithographic projection apparatus according to claim 6, wherein the modelling system is configured and arranged to determine the application-specific effect on the basis of data indicative of the selected patterning device and an illumination mode setting of the projection system.

9. Lithographic projection apparatus according to claim 1, wherein the predictive control system is configured to generate a control signal specific to the required patterned beam according to the predicted projection system aberration variation and its application-specific effect on one or more parameters of an image of a selected patterning device.

10. Lithographic projection apparatus according to claim 1, wherein an adjustment system is provided to carry out imaging adjustments based at least in part on the control signal to compensate for the effect of the predicted projection system aberration variation on an image of the selected patterning device.

11. Lithographic projection apparatus according to claim 1, wherein the predictive control system is arranged to generate the control signal in accordance with known sensitivities of a selected patterning device to projection system aberrations and a defined merit function determining relative weightings to be given to different projection system aberrations.

12. Lithographic projection apparatus according to claim 1, wherein the predictive control system is arranged to determine the projection system aberration variation on the basis of a lens heating model that predicts changes in at least one aberration value with time as a result of lens heating or cooling.

13. Lithographic projection apparatus comprising:
 a radiation system configured to provide a beam of radiation;
 a support structure configured to hold a patterning device, the patterning device capable of imparting a pattern to the beam;
 a substrate table configured to hold a substrate;
 a projection system configured to project the patterned beam onto a target portion of the substrate;
 a measurement system configured to measure changes in projection system aberrations with time;
 a predictive control system configured to predict variation of projection system aberrations with time on the basis of model parameters and to generate a control signal to compensate a time-varying property of the apparatus; and
 a measurement timing system configured to control measurements by the measurement system such that a time interval between measurements is increased if the control signal decreases below a first threshold value, and the time interval between measurements is decreased if the control signal increases above a second threshold value.

14. A device manufacturing method using lithographic projection apparatus, the method comprising:
 projecting a beam of radiation onto a selected patterning device and to produce a patterned beam and projecting the patterned beam onto a target portion of a substrate using a projection system;
 measuring changes in aberrations of the projection system with time;
 predicting variation of projection system aberrations with time on the basis of model parameters;
 generating a control signal to compensate a time-varying property of the apparatus;
 estimating model parameter errors on the basis of predicted projection system aberration values and measured projection system aberration values; and
 updating the model parameters in dependence on the model parameter errors such that the time-varying property is maintained within acceptable performance criteria.

15. A method according to claim 14, further comprising:
 generating a realignment signal when the control signal exceeds a threshold in order to trigger further projection system aberration measurement, to thereby supply updated measured aberration values; and
 using the updated measured aberration values to predict projection system aberration variation.

16. A machine readable medium containing machine executable instructions to perform a method comprising:
 measuring changes in aberrations of a projection system with time, the projection system used to project a patterned beam of radiation onto a target portion of a substrate;
 predicting variation of projection system aberrations with time on the basis of model parameters;
 generating a control signal to compensate a time-varying property of the apparatus;
 estimating model parameter errors on the basis of predicted projection system aberration values and measured projection system aberration values; and
 updating the model parameters in dependence on the model parameter errors such that the time-varying property is maintained within acceptable performance criteria.

17. The machine readable medium according to claim 16, wherein the method further comprises triggering measurements of changes in projection system aberrations such that a time interval between measurements is increased if the model parameter error decreases, and the time interval between measurements is decreased if the model parameter error increases.

18. The machine readable medium according to claim 16, wherein the method further comprises determining the application-specific effect of the predicted projection system aberration variation on one or more parameters of an image of a selected patterning device to be used to produce a specific required patterned beam.

19. The machine readable medium according to claim 16, wherein predicting variation of projection system aberrations determining the projection system aberration variation on the basis of a lens heating model that predicts changes in at least one aberration value with time as a result of lens heating or cooling.

20. A machine readable medium containing machine executable instructions to perform a method comprising:
 measuring changes in aberrations of a projection system with time with a measurement system, the projection system used to project a patterned beam of radiation onto a target portion of a substrate;
 predicting variation of projection system aberrations with time on the basis of model parameters and generating a control signal to compensate a time-varying property of the apparatus; and
 controlling measurements by the measurement system such that a time interval between measurements is increased if the control signal decreases below a first threshold value, and the time interval between measurements is decreased if the control signal increases above a second threshold value.

* * * * *